(12) United States Patent
Okumura

(10) Patent No.: US 8,224,601 B2
(45) Date of Patent: Jul. 17, 2012

(54) SEMICONDUCTOR DEVICE AND METHOD OF ESTIMATING CAPACITANCE VALUE

(75) Inventor: Takaaki Okumura, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 414 days.

(21) Appl. No.: 12/335,097

(22) Filed: Dec. 15, 2008

(65) Prior Publication Data

US 2009/0164157 A1      Jun. 25, 2009

(30) Foreign Application Priority Data

Dec. 25, 2007    (JP) ................................. 2007-332298

(51) Int. Cl.
*G01R 31/312* (2006.01)
*G06F 11/26* (2006.01)
(52) U.S. Cl. ............... 702/65; 702/64; 702/57; 327/100
(58) Field of Classification Search .................... 702/65, 702/57, 64, 117
See application file for complete search history.

(56) References Cited

U.S. PATENT DOCUMENTS

| 7,222,320 | B2 | 5/2007 | Ogawa ............................ 716/11 |
| 7,900,164 | B1* | 3/2011 | Chen et al. ..................... 716/136 |
| 2009/0106720 | A1* | 4/2009 | Nagata .............................. 716/6 |
| 2010/0007361 | A1* | 1/2010 | Yamanaka ..................... 324/678 |

FOREIGN PATENT DOCUMENTS

JP      2006-040962      2/2006

\* cited by examiner

*Primary Examiner* — Hal Wachsman
(74) *Attorney, Agent, or Firm* — Staas & Halsey LLP

(57) ABSTRACT

A semiconductor device includes an element coupled between a first power supply line and a second power supply line, and a capacitor coupled between the first power supply line and the second power supply line. A capacitance value of the capacitor is estimated based on a first value that depends on a period of a change in an input signal input to the element and a change in an output signal output from the element, and a second value that depends on a voltage between the first power supply line and the second power supply line.

11 Claims, 12 Drawing Sheets

SEMICONDUCTOR DEVICE AND METHOD OF ESTIMATING CAPACITANCE VALUE

CROSS-REFERENCE TO RELATED APPLICATIONS

This application claims the benefit of priority of Japanese Patent Application No. 2007-332298 filed on Dec. 25, 2007, the entire contents of which are incorporated herein by reference.

BACKGROUND

1. Field

The present application relates to a semiconductor device and a method of estimating capacitance value.

2. Description of the Related Art

In development of semiconductor devices in recent years, a finer process, higher integration, a faster operating frequency, and a lower power supply voltage have been promoted. Since power supply noise is caused by the operation of instances formed in a conventional semiconductor device, logical malfunction, and malfunction due to timing shift are significant when higher speed and lower voltage are achieved. In a stage of design, an apparatus used in association with designing the conventional semiconductor device estimates the total power consumption of logic cells placed in a target region, and places decoupling capacitors corresponding to the total power consumption, in the target region and near target instances, in a dispersed manner.

The conventional semiconductor device includes a plurality of types of instances coupled to each other. In the instances, the power supply voltage fluctuation amount that affects operation is different. In other words, the noise tolerance of the instances is different.

According to a conventional method for designing the conventional semiconductor device, the capacitance value of decoupling capacitors is greater than a capacitance value required for the configuration of the semiconductor device. Many decoupling capacitors formed in the conventional semiconductor device increase the chip area required for the conventional semiconductor device.

SUMMARY

According to aspects of the embodiments, a semiconductor device includes an element coupled between a first power supply line and a second power supply line, and a capacitor coupled between the first power supply line and the second power supply line. The device and method includes estimating a capacitance value of the capacitor based on a first value that depends on a period of a change in an input signal input to the element and a change in an output signal output from the element, and a second value that depends on a voltage between the first power supply line and the second power supply line.

Additional aspects and/or advantages will be set forth in part in the description which follows and, in part, will be apparent from the description, or may be learned by practice of the invention.

BRIEF DESCRIPTION OF THE DRAWINGS

These and/or other aspects and advantages will become apparent and more readily appreciated from the following description of the embodiments, taken in conjunction with the accompanying drawings of which.

DETAILED DESCRIPTION OF EMBODIMENTS

Figure 1:
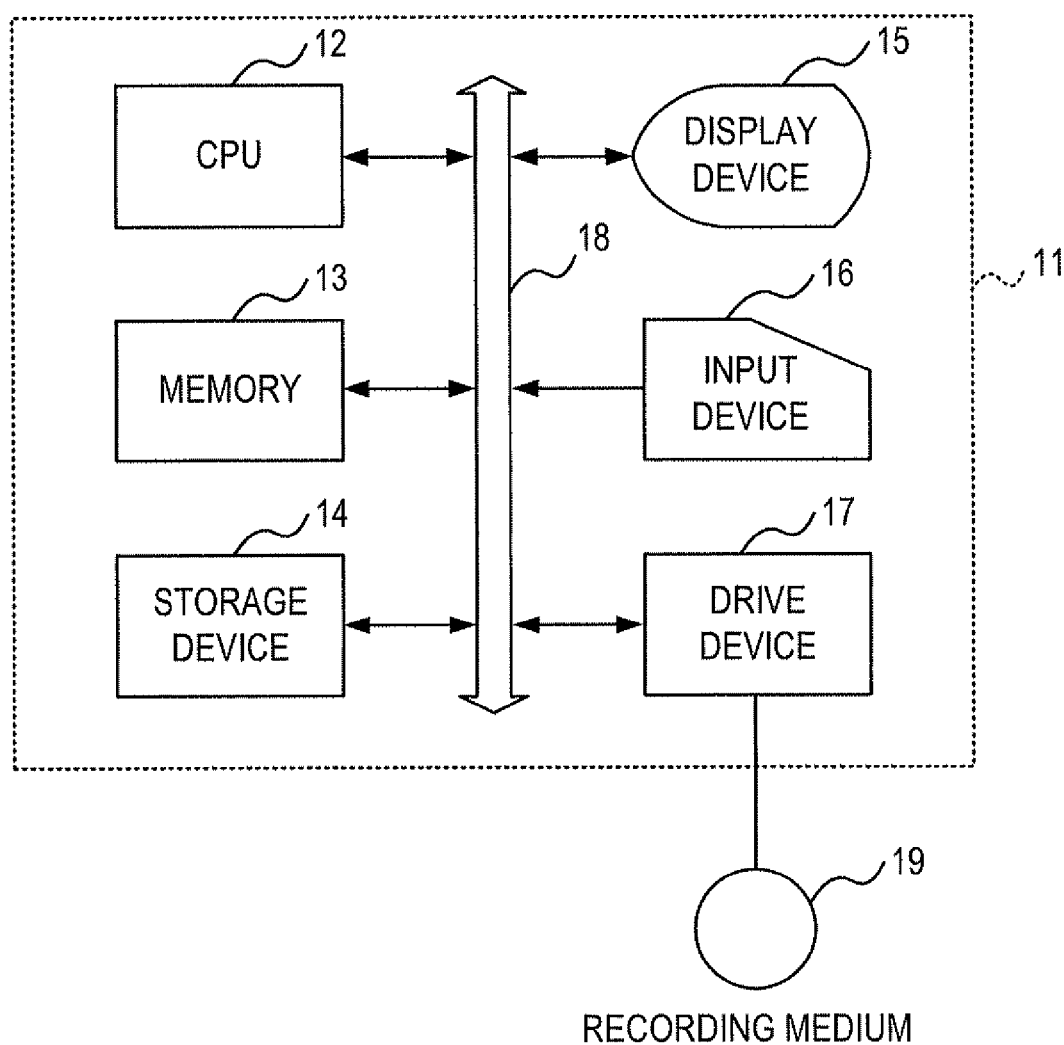
FIG. 1 illustrates a schematic of a design apparatus related to embodiment(s)

Reference will now be made in detail to the embodiments, examples of which are illustrated in the accompanying drawings, wherein like reference numerals refer to the like elements throughout. The embodiments are described below by referring to the figures.

An embodiment will be described below with reference to FIG. 1 to FIGS. 9A, 9B and 9C.

A design apparatus related to the embodiments is shown in FIG. 1. A design apparatus 11 may include a central processing unit (hereinafter CPU) 12, a memory 13, a storage device 14, a display device 15, an input device 16, and a drive device 17. Structures included in the design apparatus 11 are coupled to each other via a bus 18.

The CPU 12 of FIG. 1 executes a program, utilizing the memory 13, and implements an operation in relation to placement of decoupling capacitance. The words (terms) capacitance and capacitor may be used interchangeably throughout the description. The decoupling capacitance indicates a capacitance cell having a shape according to a required capacitance value, or a group of capacitance cells in which a plurality of capacitance cells are coupled according to a required capacitance value. A program and data required for performing a decoupling capacitance placement operation are stored in the memory 13. As the memory 13, for example, a cache memory, a system memory, a display memory, or the like (not shown) may be used.

The display device 15 of FIG. 1 is used for displaying information, such as layout display and a parameter input screen. As the display device 15, for example, a CRT, an LCD, a PDP, or the like (not shown) may be used. The input device 16 is used for the input of demand(s) and instruction(s) from the user, and parameters. As the input device 16, for example, a keyboard, a mouse device, and the like (not shown) may be used.

Figure 3:
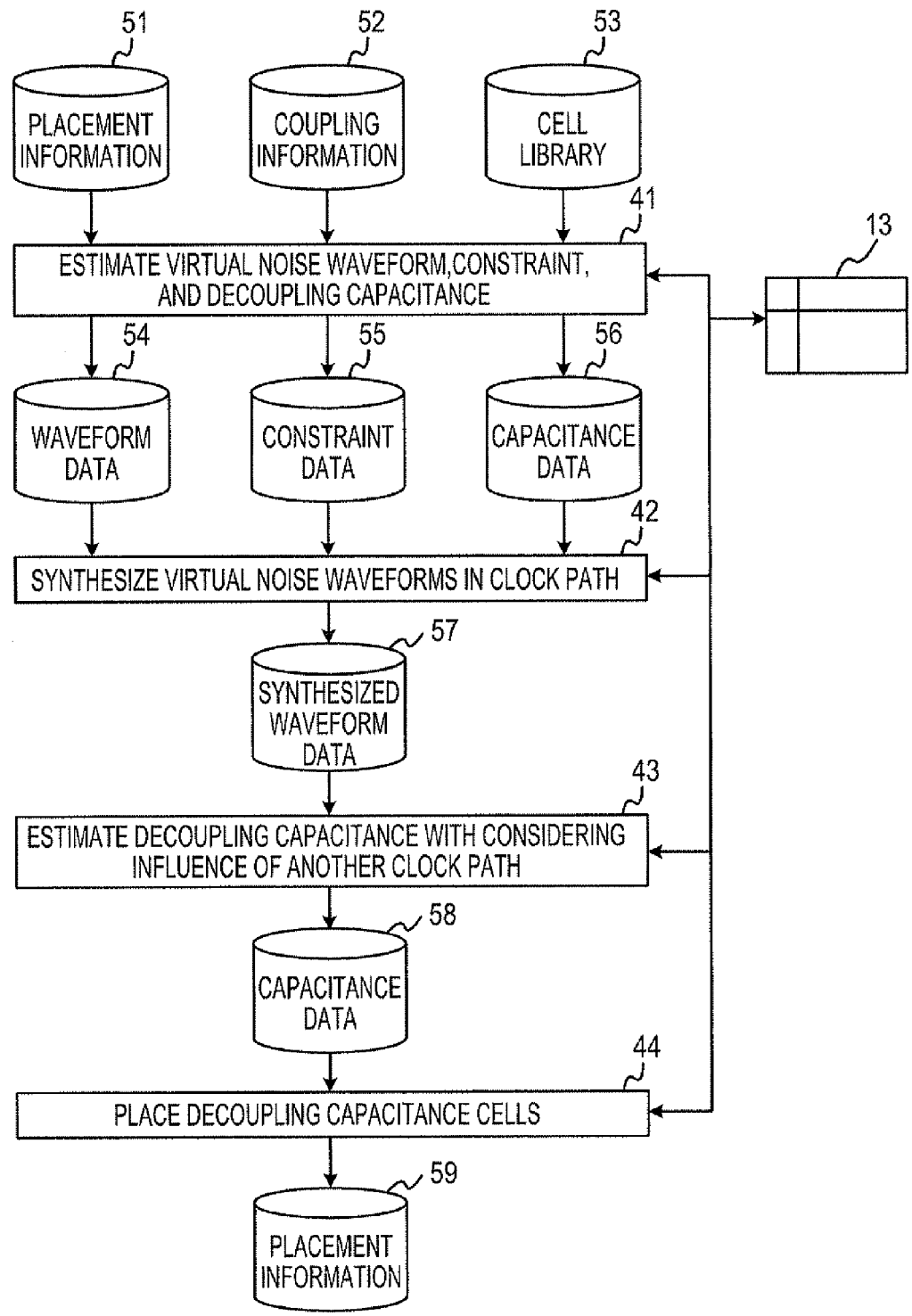
FIG. 3 illustrates a flow chart of a decoupling capacitance placement operation related to the embodiment of FIG. 2.

The storage device 14 of FIG. 1 may include, for example, a magnetic disk device, an optical disk device, a magneto-optical disk device, and the like (not shown). Program data (hereinafter a program) and various types of data such as files (hereinafter files) 51 to 53 for a decoupling capacitance placement operation shown in FIG. 3 are stored in the storage device 14. The CPU 12 properly transfers the program, and data stored in the various files to the memory 13 in response to an instruction via the input device 16, and sequentially executes the program. The CPU 12 performs operation(s) such as reading of file(s) and data required for the execution of the program, and creation of files and data by execution of the program with respect to the storage device 14. The storage device 14 may be used as a database.

The program executed by the CPU 12 of FIG. 1 is provided by a recording medium 19. The drive device 17 drives the recording medium 19 and accesses its storage contents. The CPU 12 reads the program from the recording medium 19 via the drive device 17 and installs it in the storage device 14. Those stored in the recording medium 19 and provided are not limited to programs, and various data, such as a library, may be provided.

As the recording medium 19 of FIG. 1, any computer readable recording medium, for example, a memory card, a flexible disk, an optical disk (CD-ROM, DVD-ROM, and the like) a magneto-optical disk (MO, MD, and the like), and the like (not shown), may be used. A semiconductor memory, an externally coupled hard disk device, and the like may be used. The above-described program may be stored in the recording medium 19, and loaded into the memory 13 and used as required.

The recording medium 19 of FIG. 1 may include, for example, a medium in which a program uploaded or downloaded via a communication medium is recorded, a disk device, a storage device of a server device to which the design apparatus 11 (a computer) is coupled via a communication medium, and the like. Further, the recording medium 19 of FIG. 1 may include not only a recording medium in which a program that is directly executed by a computer is recorded, but also a recording medium in which a program that is made executable by being installed in the recording medium itself or another recording medium (a hard disk and the like) is recorded, and a recording medium in which an encrypted and/or compressed program is recorded.

Figure 2:
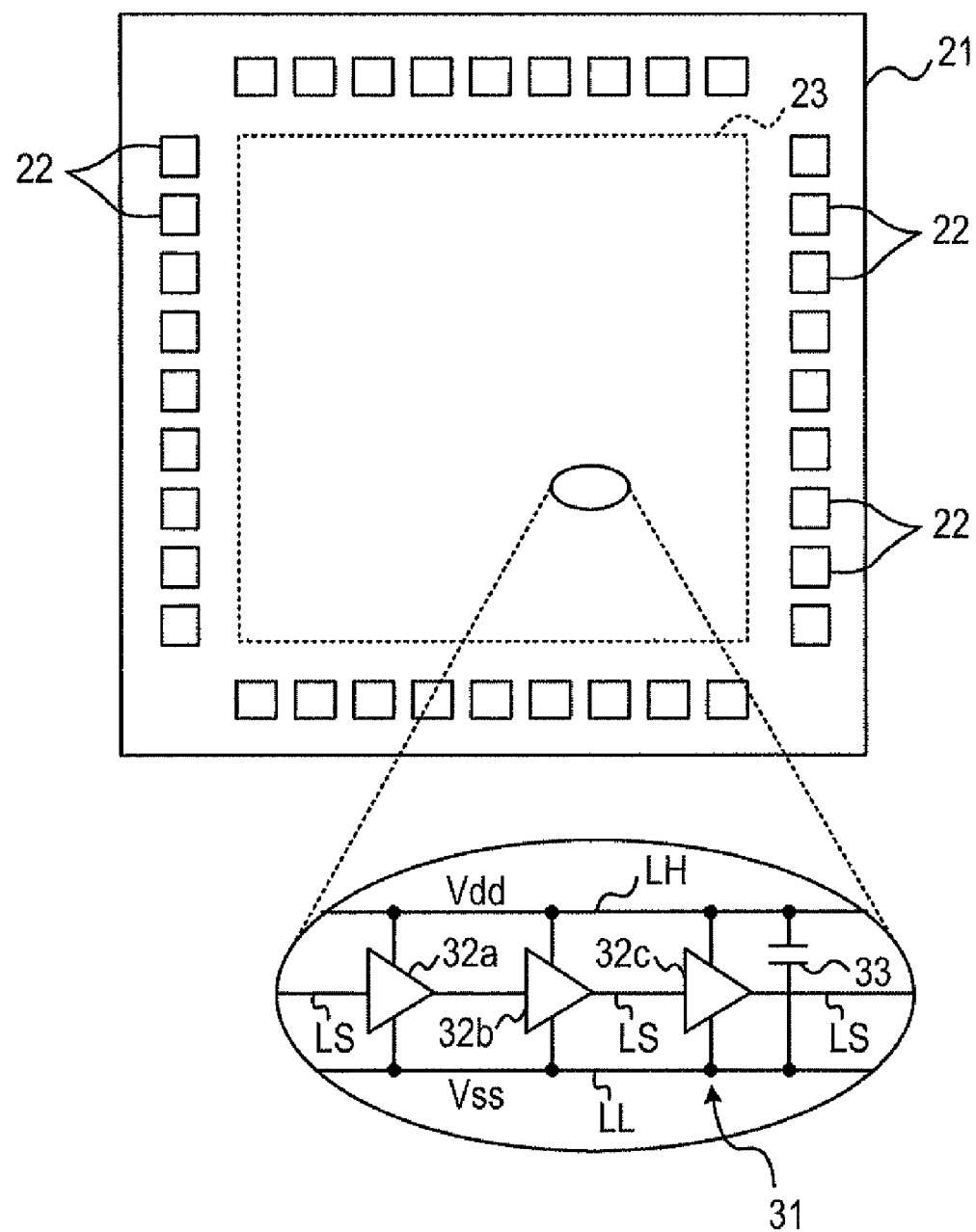
FIG. 2 illustrates a semiconductor device according to an embodiment.

As shown in FIG. 2, the semiconductor device 21 designed by the design apparatus 11 of FIG. 1 may be formed in a rectangular shape, for example. A plurality of pads 22 are formed along rectangular sides. An internal circuit 23 is formed inside the formation of the pads 22. The internal circuit 23 includes a clock path 31, as shown in an enlarged view in the lower part of FIG. 2. The clock path 31 is a path that transmits a clock signal between two predetermined terminals, and includes a plurality of logic cells (buffer cells) in the path. The clock signal is transmitted between the two predetermined terminals via the logic cells. Three buffer cells 32a to 32c constituting the clock path 31 are shown in FIG. 2.

As further shown in FIG. 2, each of the buffer cells 32a to 32c is coupled between a first power supply line LH that supplies high potential voltage Vdd to each circuit and a second power supply line LL that supplies low potential voltage Vss. The buffer cells 32a to 32c are coupled by wiring LS that transmits a signal. An instance (not shown) that supplies a signal to the buffer cell 32a, and the buffer cell 32b are coupled by the wiring LS. An instance (not shown) to which a signal output from the buffer cell 32b is supplied, and the buffer cell 32c are coupled by the wiring LS.

A decoupling capacitance 33 is coupled between the first power supply line LH and the second power supply line LL. The capacitance value of the decoupling capacitance 33 is estimated by the design apparatus 11 of FIG. 1 according to a flow chart shown in FIG. 3.

As further shown in FIG. 2, schematically, the capacitance value of the decoupling capacitance 33 is estimated based on delay constraint for each instance, which is a noise source of the semiconductor device 21. The capacitance value of the decoupling capacitance 33 is further estimated considering the influence of an asynchronous operation.

As further shown in FIG. 2, the signal propagation time in an instance corresponds to power supply voltage supplied to the instance. Therefore, when the power supply voltage fluctuates due to noise, the signal propagation delay time in the instance fluctuates. By the operation of the semiconductor device 21, an allowable delay fluctuation amount, that is, an allowable fluctuation amount of delay time, in the instance is estimated. By estimating the allowable delay fluctuation amount, an allowable voltage fluctuation amount in the instance, that is, the fluctuation amount of the power supply voltage supplied to the instance is estimated. By estimating the capacitance value of the decoupling capacitance according to the allowable voltage fluctuation amount, the decoupling capacitance having a capacitance value according to the operation of the instance is placed. In other words, the allowable delay fluctuation amount and the allowable voltage fluctuation amount are delay constraint. By estimating the capacitance value of the decoupling capacitance according to the operation of the instance, the placement of the decoupling capacitance having a capacitance value greater than necessary may be prevented, for example. By preventing the placement of the decoupling capacitance greater than necessary for example, the chip area of the semiconductor device 21 is reduced.

Next, the decoupling capacitance placement operation in the design apparatus 11 of FIG. 1 will be described with reference to FIG. 3.

As shown in FIG. 3, the design apparatus 11 of FIG. 1 performs the estimation of a number and an amount of decoupling capacitances corresponding to the semiconductor device (LSI) 21 of FIG. 2, and placement of the estimated number of decoupling capacitances by executing operations 41 to 44. In the aforementioned operations, the design apparatus 11 of FIG. 1 judges whether the placement of an additional decoupling cell is necessary or not, based on a numerical value estimated based on data (information) in files 51 to 53, and stores decoupling cell position information in the file 53. These files 51 to 53 are stored in the storage device 14 of FIG. 1. Also, the design apparatus 11 of FIG. 1 stores temporary data estimated in the above operations in the memory 13 of FIG. 1. The design apparatus 11 of FIG. 1 may store the temporary data in a storage device, such as the storage device 14 of FIG. 1.

As further shown in FIG. 3, placement information (layout data) 51, coupling information (net list) 52, and a cell library 53 are stored, for example, in the storage device 14 of FIG. 1. The placement information 51 and the coupling information 52 are created by logic synthesis or the like. The placement information 51 is data that shows, for example, the type or placement position of instances (logic cells, circuit blocks, or the like), wiring, vias, and the like constituting the semiconductor device 21. The coupling information 52 is data that shows the coupling relationship, the so-called net, of the instances, the pads 22, and the like. Data, such as the logic function of various instances, the electrical characteristics and physical structure of the instances, decoupling capacitances, and the like, are stored in the cell library 53.

As further shown in FIG. 3, in operation 41 (a waveform generation operation), the design apparatus 11 of FIG. 1 reads the placement information 51 and the coupling information 52 and refers to the cell library 53 to estimate a virtual noise waveform based on delay constraint for each instance, which is a noise source on a clock path. Constraint in the clock path is estimated from the virtual noise waveforms. Further, the design apparatus 11 of FIG. 1 estimates decoupling capacitance for the clock path, based on the estimated constraint. The design apparatus 11 of FIG. 1 stores waveform data 54 including the obtained virtual noise waveforms, constraint data 55 including the constraint, and capacitance data 56 including the decoupling capacitance, in the storage device 14.

As further shown in FIG. 3, in operation 42 (a waveform synthesis operation), the design apparatus 11 of FIG. 1 reads the virtual noise waveform obtained for each instance from the waveform data 54, and synthesizes the plurality of virtual noise waveforms to generate a synthesized noise waveform in the clock path. The synthesized waveform data of the synthesized noise waveform 57 is stored in the storage device 14 of FIG. 1.

As further shown in FIG. 3, in operation 43 (a constraint estimation operation), the design apparatus 11 of FIG. 1 estimates, for each clock path, decoupling capacitance considering the influence of another clock path, based on the synthesized noise waveform. Capacitance data 58 including the decoupling capacitance is stored in the storage device 14 of FIG. 1.

As further shown in FIG. 3, in operation 44 (a decoupling capacitance placement operation), the design apparatus 11 of FIG. 1 places the number of decoupling capacitances 33 that corresponds to the decoupling capacitance of the capacitance data 56 and 58, near the instances. The design apparatus 11 of FIG. 1 generates layout data 59 including the placement information of layout data 51, and placement positions where the number of decoupling capacitances 33 that corresponds to the decoupling capacitance of capacitance data 56 and 58 are placed.

The operation in each of operations 41 to 44 of FIG. 3 will be described with reference to FIGS. 4 to 9A, 9B and 9C.

The design apparatus 11 of FIG. 1 estimates an allowable delay fluctuation amount ΔD for each instance, which is a noise source. The design apparatus 11 of FIG. 1 determines a margin for the ideal delay time of the instance Dideal as the allowable delay fluctuation amount ΔD.

Figure 4:
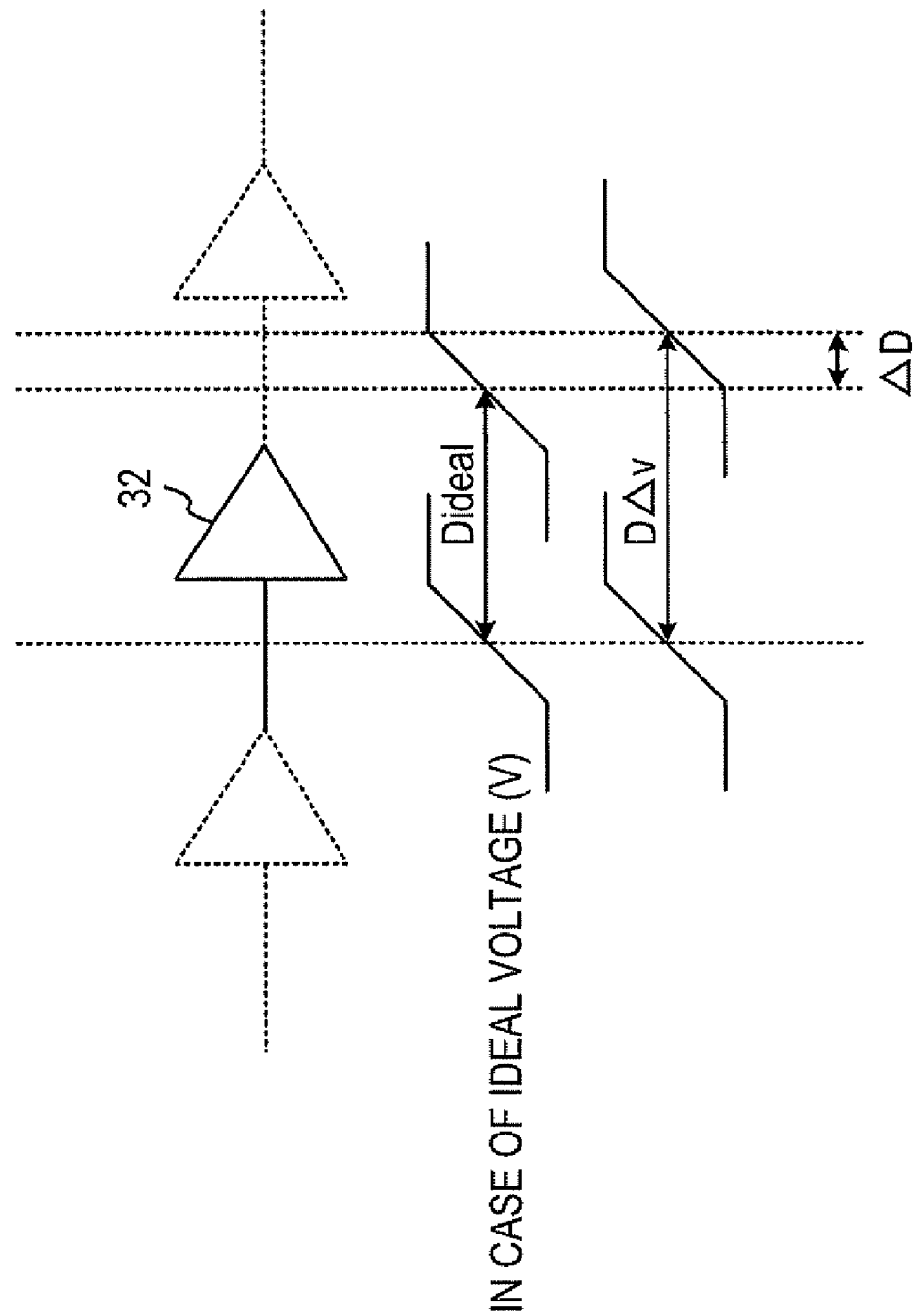
FIG. 4 illustrates a view of a virtual noise waveform estimation operation.

As shown in FIG. 4, the ideal delay time Dideal is the delay time of an output signal with respect to an input signal in an instance 32 to which ideal voltage (power supply voltage without fluctuation) is supplied. When the power supply voltage fluctuates (decreases), the delay time in the instance 32 increases. When the delay time during the voltage fluctuation is DΔV, the difference between the ideal delay time Dideal and the delay time DΔV is the allowable delay fluctuation amount ΔD.

The allowable delay fluctuation amount ΔD may be a fixed value (for example, 10 ps), or a predetermined rate of the ideal delay time Dideal (for example, 10 percent). It may be estimated, referring to a slack amount in timing analysis result.

The design apparatus 11 of FIG. 1 refers to the voltage-delay characteristics of the instance and estimates an allowable voltage fluctuation amount ΔV.

Figure 5:
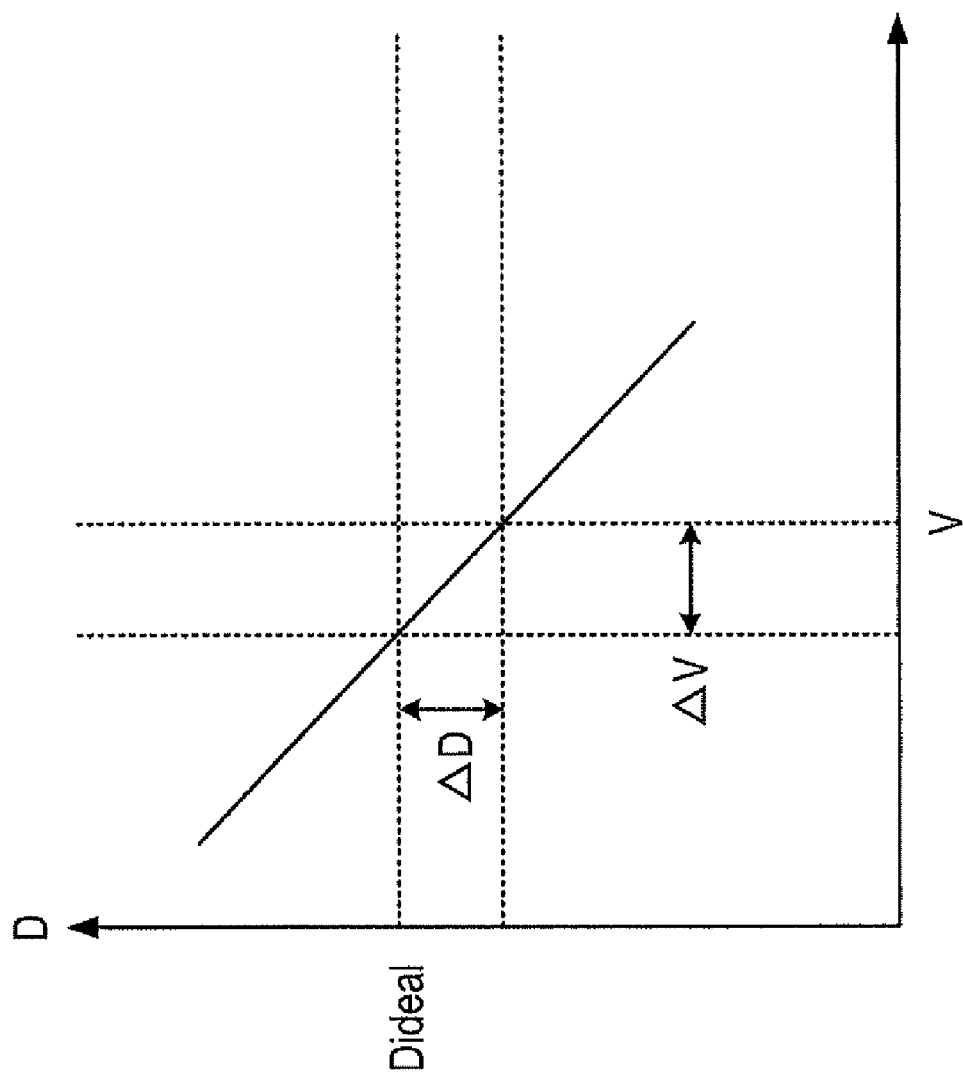
FIG. 5 illustrates a view of the virtual noise waveform estimation operation.

One example of the voltage-delay characteristics is shown in FIG. 5. The characteristics are stored in the cell library 53 shown in FIG. 3. The design apparatus 11 of FIG. 1 refers to the cell library 53 of FIG. 3, and determines a voltage change amount with respect to the allowable delay fluctuation amount ΔD as the allowable voltage fluctuation amount ΔV in the referred characteristics. The voltage-delay characteristics may be obtained by simulation, and the allowable voltage fluctuation amount ΔV may be estimated from the characteristics.

Figure 6:
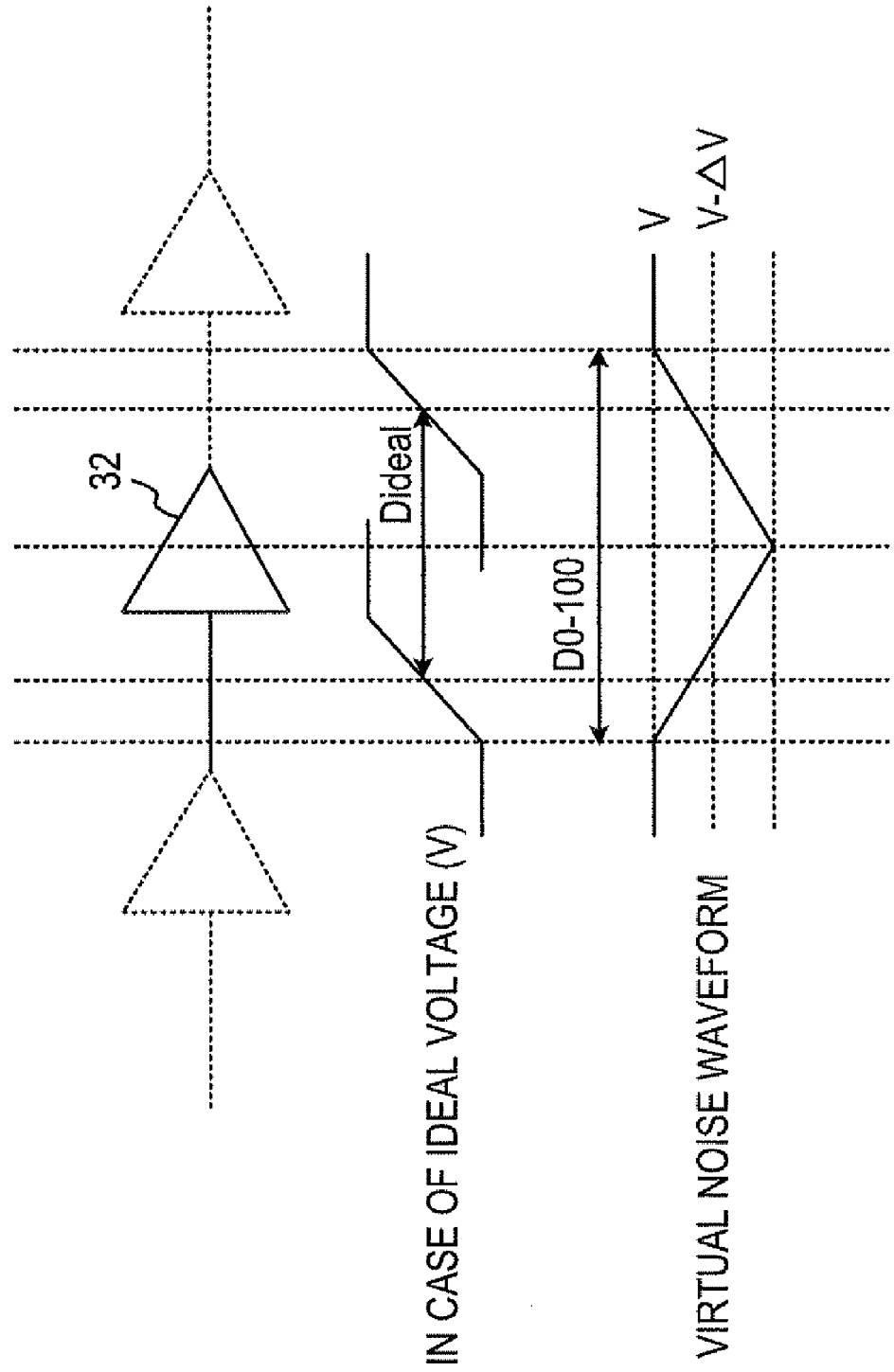
FIG. 6 illustrates a view of the virtual noise waveform estimation operation.

As shown in FIG. 6, the design apparatus 11 of FIG. 1 generates a virtual noise waveform corresponding to the above allowable delay fluctuation amount ΔD. The fluctuation in power supply voltage may be considered such that when voltage change with respect to the operation of the instance is statically considered, the power supply voltage fluctuates by the allowable voltage fluctuation amount ΔV during the ideal delay time Dideal in the instance. Therefore, the area of the noise waveform may be the product of the operation period of the instance, that is, the ideal delay time Dideal in the instance, and the allowable voltage fluctuation amount ΔV.

The design apparatus 11 of FIG. 1 determines the noise waveform as a waveform in which a power supply voltage fluctuation waveform is modeled into a simple shape, for example, a triangular waveform. The design apparatus 11 of FIG. 1 estimates the width of noise, that is, the length of the base of the triangular waveform according to the signal delay time in the instance. For example, the start of a change in the input signal is "0%," the end of a change in the output signal is "100%," and the period expressed as "D0-100%" using percentage is the length of the base.

The design apparatus of FIG. 1 estimates decoupling capacitance Cd satisfying the constraint of the allowable voltage fluctuation amount ΔV by, for example, equation (1), in which F is the operating frequency of the instance, I is the current consumption amount of the instance, and Cp is the value of parasitic capacitance in and around the instance.

$$Cd = \frac{Vdd - \Delta V}{\Delta V} \times \frac{I}{F \times Vdd} + Cp \quad (1)$$

Figure 7:
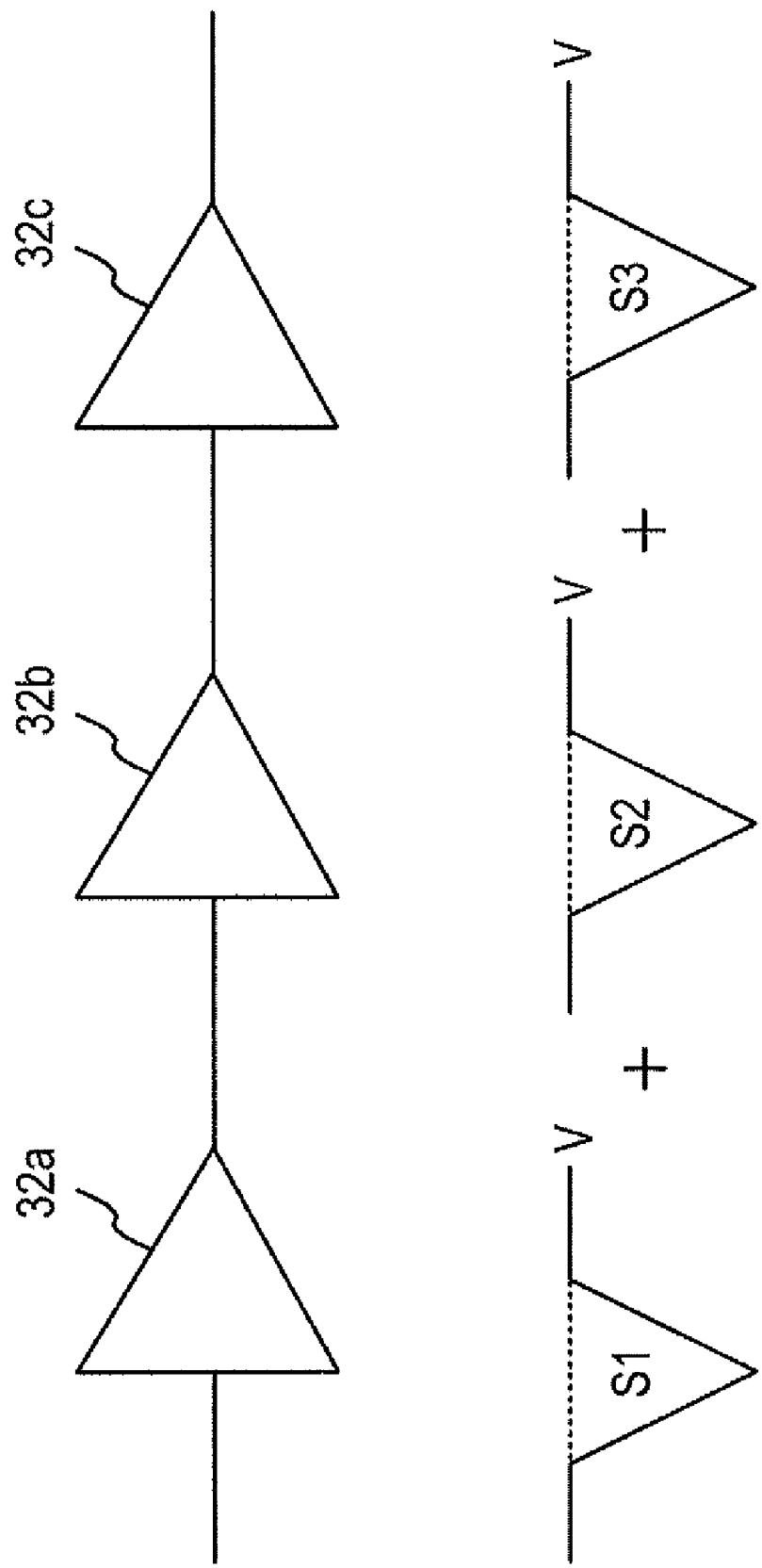
FIG. 7 illustrates a view of a noise waveform synthesis operation.

As shown in FIG. 7, the design apparatus 11 of FIG. 1 generates virtual noise waveforms S1 to S3 corresponding to instances 32a to 32c included in a clock path. The design apparatus 11 of FIG. 1 estimates the allowable voltage fluctuation amount ΔV as constraint, and the decoupling capacitance Cd for each instance.

The design apparatus 11 of FIG. 1 synthesizes the virtual noise waveforms generated for the instances included in the clock path in the operation 41 of FIG. 3, and generates a virtual noise waveform in the clock path. For example, the virtual noise waveforms S1 to S3 corresponding to three instances 32a to 32c shown in FIG. 7 are waveform-synthesized.

Figure 8:
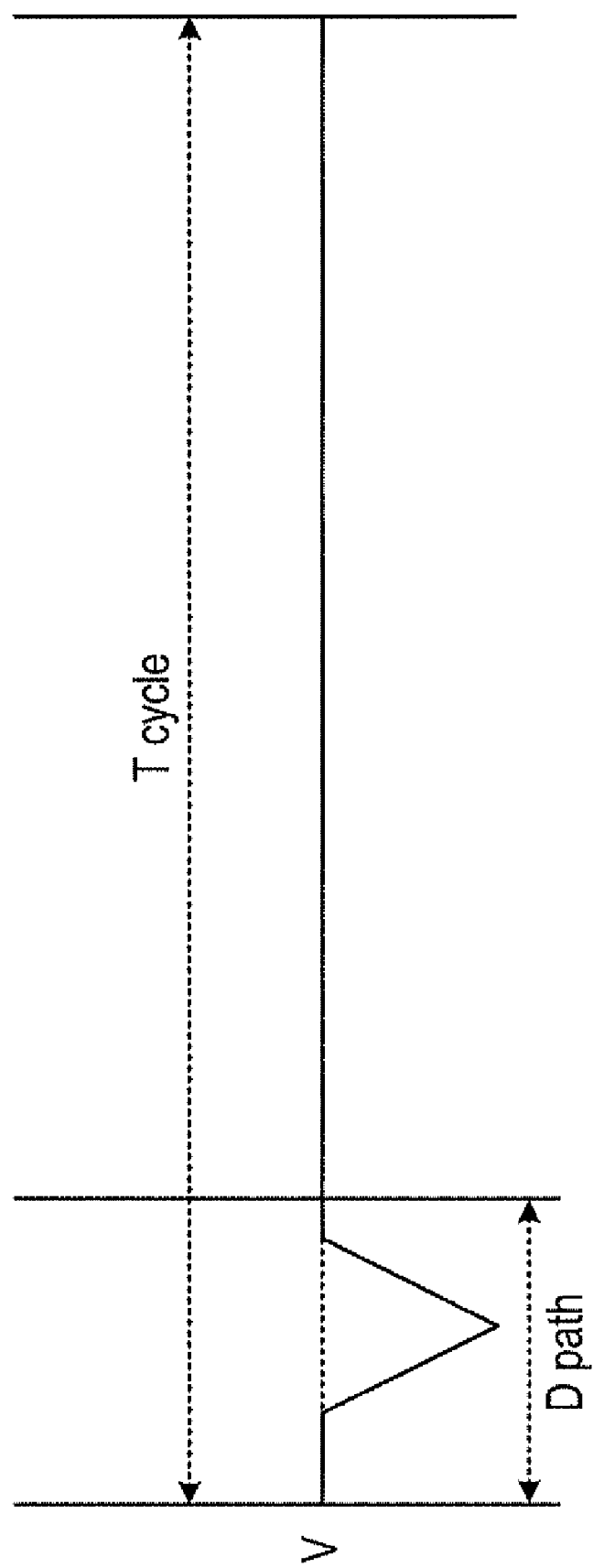
FIG. 8 illustrates a view of a noise waveform synthesis operation.

As a result, as shown in FIG. 8, a synthesized noise waveform having an area equal to the total value of the areas of all virtual noise waveforms (=ΣS) is obtained at the position of a time span during which the level of a clock signal transmitted via the clock path changes (path delay time Dpath) within cycle time (Tcycle) corresponding to the frequency of the clock signal transmitted in the clock path.

The design apparatus 11 of FIG. 1 estimates decoupling capacitance considering the influence between clock paths asynchronous with each other.

As shown in FIGS. 9 (A) and 9 (B), as one example, n clock paths are present in the semiconductor device 21, and noise propagation is considered between an i-th clock path Pi and a j-th clock path Pj. With respect to the noted path Pi, decoupling capacitance corresponding to noise propagated from the other clock path Pj is estimated. The frequencies of the clock path Pi and the clock path Pj, that is, the operating frequency of instances included in the clock path Pi and the operating frequency of instances included in the clock path Pj are different. Signal change in the clock path Pi and signal change in the clock path Pj are asynchronous.

As further shown in FIG. 9, the target clock path Pj may be considered to be affected by the noted path Pi during a time span that is a noise generation period in the noted path Pi, that is, path delay time Dpi. In the period, the total value of voltage fluctuation due to noise generated in the clock path Pj and voltage fluctuation due to noise generated in the noted path Pi is a value considering the influence between both clock paths Pi and Pj. The design apparatus 11 of FIG. 1 obtains a value (an average voltage drop amount) by dividing a total value of the magnitude of noise in the noted path Pi (area ΣSi) and the magnitude of noise generated in the target clock path Pj within the path delay time Dpi (area ΣSj) by the path delay time Dpi.

Figure 9A:
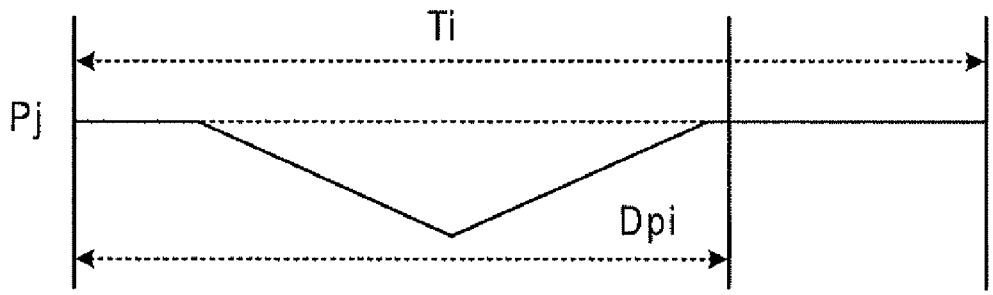
FIGS. 9A, 9B and 9C illustrate explanatory views of an operation for influence between asynchronous paths.
Figure 9B:
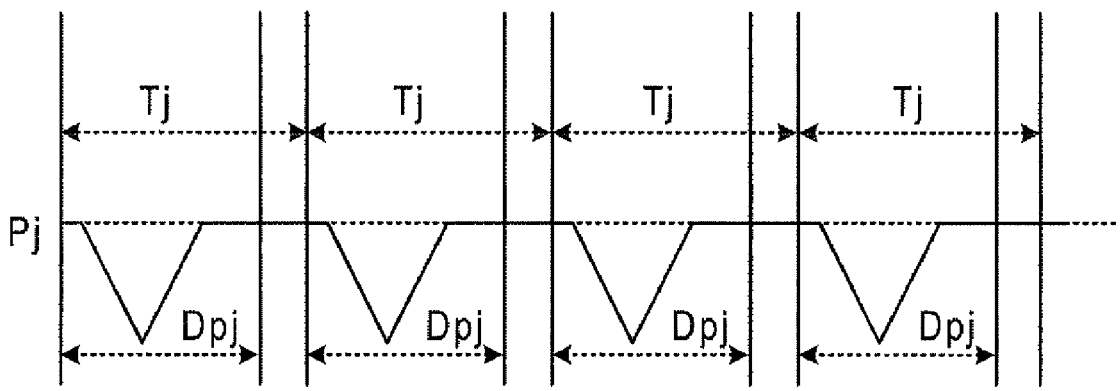
Figure 9C:
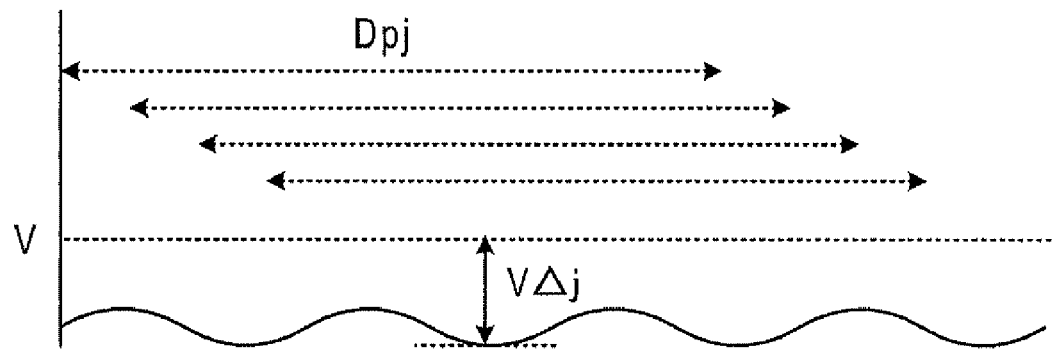

As further shown in FIGS. 9A, 9B and 9C, since both clock paths Pi and Pj are asynchronous, timing when signals in both paths change may not be constant. Therefore, the above average voltage drop amount value is estimated, relatively shifting the timing of signal change in both clock paths Pi and Pj. As a result, as shown in FIG. 9 (C), an average voltage fluctuation amount ΔVj changes according to the timing of signal change in both clock paths Pi and Pj.

For the thus changing average voltage fluctuation amount ΔVj, the decoupling capacitance is set to correspond to the case where the power supply voltage is lowest. In other words, decoupling capacitance Cdj is estimated according to the maximum value of the average voltage fluctuation amount ΔVj. The design apparatus 11 of FIG. 1 estimates the decoupling capacitance Cdj, using the average voltage fluctuation amount ΔVj, using the above equation (1).

As further shown in FIG. 9, the design apparatus 11 of FIG. 1 estimates the above decoupling capacitance for each of other asynchronous paths with respect to the noted path Pi. Further, the design apparatus 11 of FIG. 1 estimates the above decoupling capacitance for each of clock paths included in the semiconductor device 21. The magnitude of noise (area) may be changed according to the physical distance between the paths.

The design apparatus 11 of FIG. 1 places decoupling capacitance corresponding to the decoupling capacitance Cd estimated in operation 41 for each instance targeted in operation 41, and the total value of the decoupling capacitances Cdj (ΣCdj) estimated in operation 43, near the instances. In this case, the design apparatus 11 of FIG. 1 places the number of capacitance cells having a predetermined capacitance (unit capacitance cells) that satisfies the above decoupling capacitance (=Cd+ΣCdj). The magnitude of the decoupling capacitance may be changed according to the above decoupling capacitance (=Cd+ΣCdj).

As described above, according to an embodiment, the following effects are obtained.

(1) The semiconductor device 21 of FIG. 2 has the instances 32a to 32c coupled between the first power supply line LH and the second power supply line LL, and the decoupling capacitance 33 coupled between the first power supply line LH and the second power supply line LL. The wiring LS in which a signal is propagated is coupled to the instances 32a to 32c. The capacitance value of the decoupling capacitance 33 is a capacitance value based on the allowable delay fluctuation amount ΔD that depends on a period from a change in an input signal to a change in an output signal in the wiring LS, and the allowable voltage fluctuation amount ΔV that depends on voltage between the first power supply line LH and the second power supply line LL. Therefore, since the capacitance value of the decoupling capacitance 33 is determined based on the allowable delay fluctuation amount ΔD corresponding to the operation of the instances 32a to 32c, and the allowable voltage fluctuation amount ΔV depending on power supply voltage supplied to the instances 32a to 32c, the decoupling capacitance 33 having a preferable capacitance value is placed, and the region of the chip that is occupied by the capacitance is adjusted so that the capacitance value may be not greater than necessary, for example.

(2) In the instances 32a to 32c, signal propagation delay time increases due to fluctuation (drop) in power supply voltage. Therefore, by using the allowable delay fluctuation amount and the allowable voltage fluctuation amount, the capacitance value of the decoupling capacitance 33 is estimated based on the operation of the instances 32a to 32c, and the voltage that fluctuates due to the operation of the instances 32a to 32c.

(3) The allowable delay fluctuation amount ΔD is estimated based on the delay time of an output signal with respect to an input signal when the instances 32a to 32c are at the ideal voltage, and the allowable voltage fluctuation amount ΔV is estimated from the allowable delay fluctuation amount ΔD, based on the electrical characteristics of the instances 32a to 32c. Therefore, since the allowable delay fluctuation amount ΔD and the allowable voltage fluctuation amount ΔV are estimated according to the operation of the instances 32a to 32c, the decoupling capacitance 33 having a capacitance value suitable for the instances 32a to 32c is placed.

(4) By estimating the allowable voltage fluctuation amount ΔV based on voltage fluctuation estimated based on the virtual noise waveforms of the clock paths Pi and Pj in an asynchronous relationship with each other, the decoupling capacitance 33 having a capacitance value considering the influence between the clock paths Pi and Pj in an asynchronous relationship is placed.

An embodiment will be described below with reference to FIG. 10 to FIG. 12.

For convenience of explanation, structures similar to those of the above-discussed embodiment are denoted by the same numerals, and their description is partly omitted.

Figure 10:
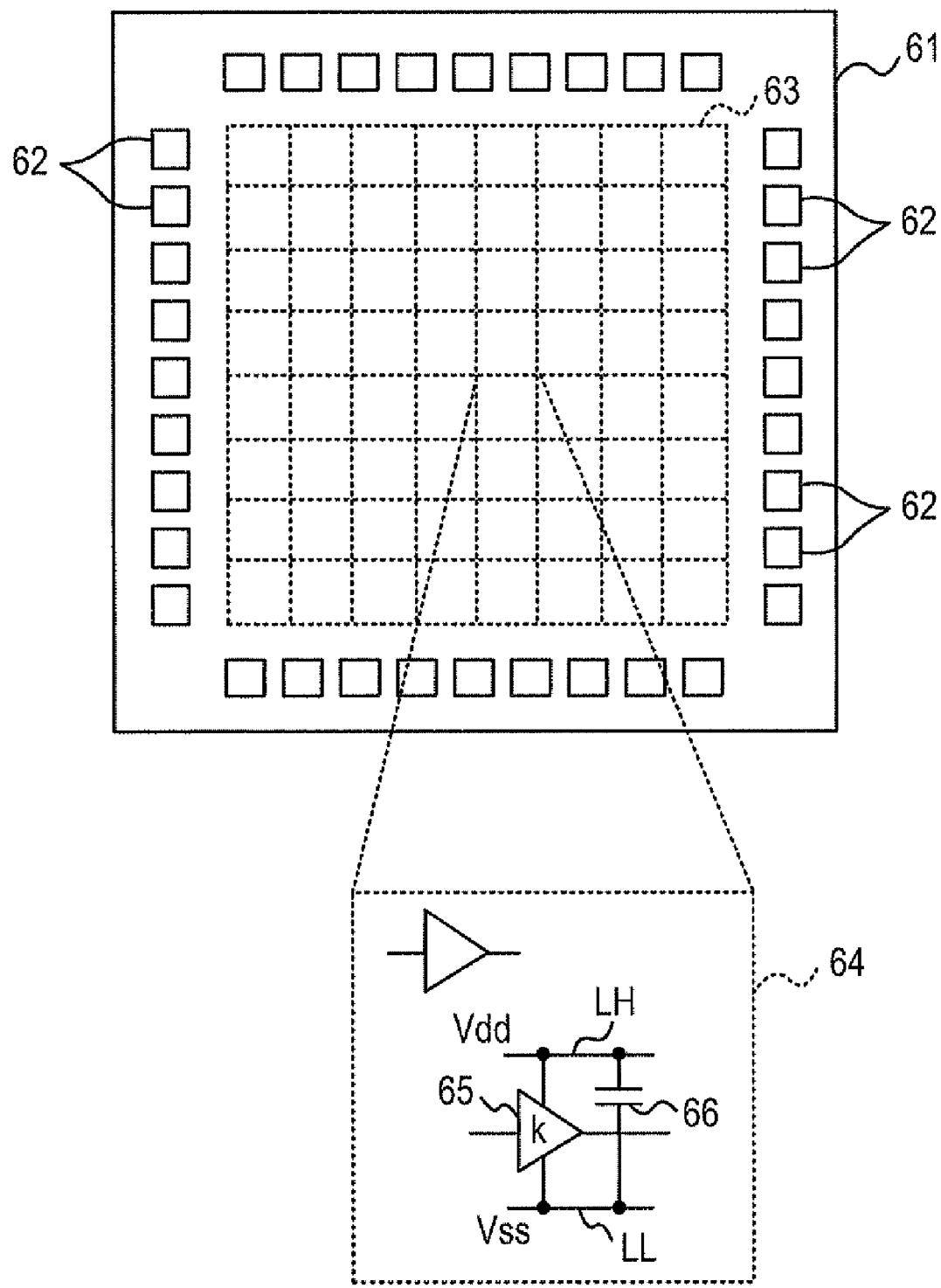
FIG. 10 illustrates a semiconductor device.

In an embodiment, a design apparatus that generates data for making a semiconductor device 61 shown in FIG. 10 has the same configuration as that of, for example, the design apparatus 11 of FIG. 1. A program for the operation executed by the design apparatus 11, that is, the decoupling capacitance placement operation stored in the storage device 14 is different. Therefore, in this embodiment, the decoupling capacitance placement operation, and the semiconductor device 61 made by the operation will be described.

As shown in FIG. 10, the semiconductor device 61 is formed in a rectangular shape. A plurality of pads 62 are formed along its rectangular sides. An internal circuit 63 is formed inside the pads 62 where the circuit 63 is surrounded by at least some of the pads 62. The internal circuit 63 is constituted by coupling instances and the like by wiring. Power supply voltage (high potential voltage and low potential voltage) is supplied to the instances by power supply lines. A decoupling capacitance 66 is coupled between a first power supply line LH that supplies high potential voltage Vdd to the instances and a second power supply line LL that supplies low potential voltage Vss.

Figure 11:
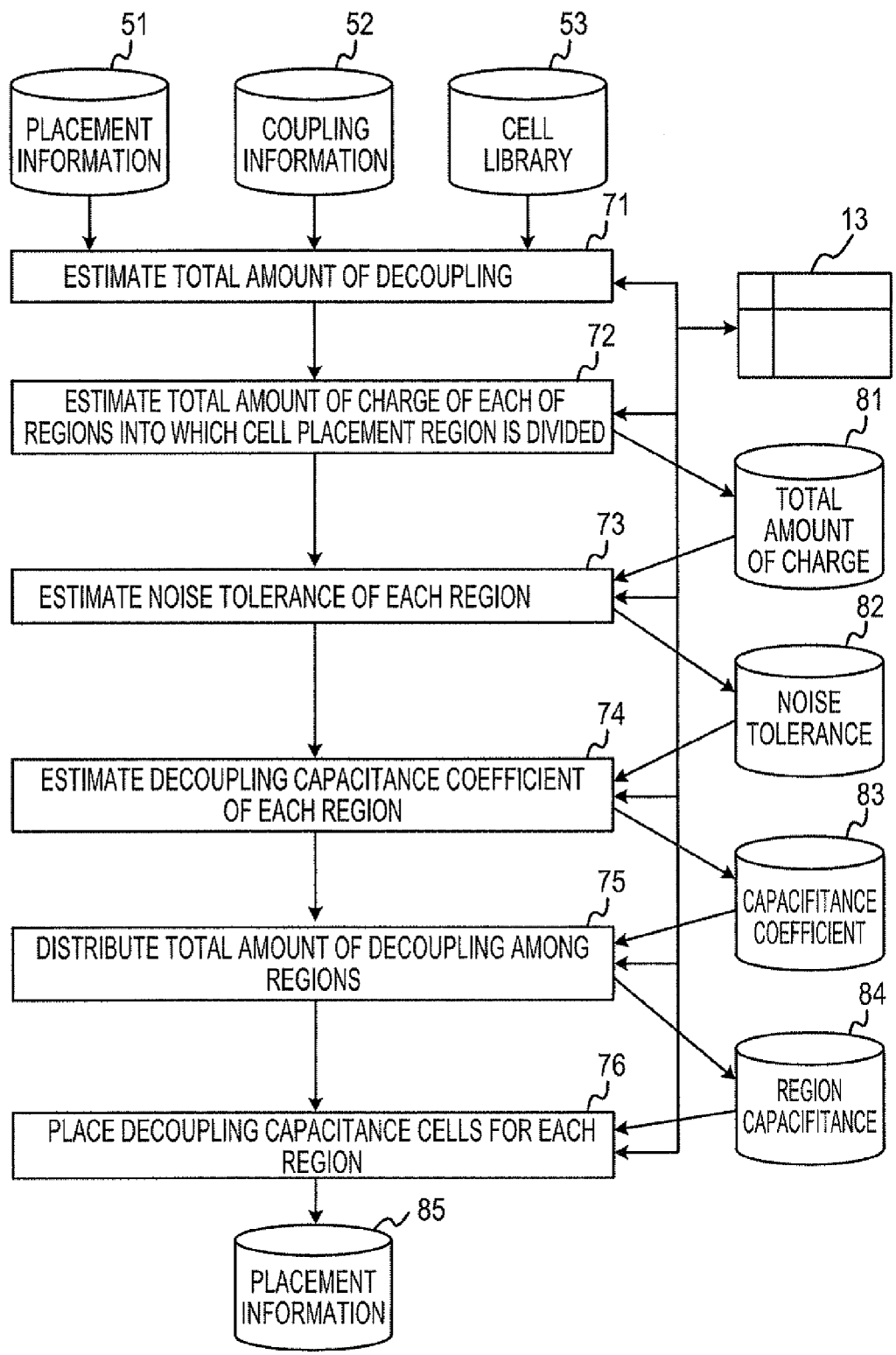
FIG. 11 illustrates a flow chart of a decoupling capacitance placement operation related to the embodiment of FIG. 10.

As further shown in FIG. 10, the capacitance value of the decoupling capacitance is estimated by the design apparatus 11 of FIG. 1 according to a flow chart shown in FIG. 11. Schematically, the design apparatus 11 of FIG. 1 divides the internal circuit 63 into a plurality of regions 64, estimates the capacitance value of decoupling capacitance placed in each region 64, based on the delay constraint (the allowable delay fluctuation amount and the allowable voltage fluctuation amount) of an instance 65 included in each region 64, and places the decoupling capacitance in the region 64.

The decoupling capacitance placement operation in the design apparatus 11 of FIG. 1 will be described with reference to FIG. 11.

The design apparatus 11 of FIG. 1 performs the estimation of the number and amount of decoupling capacitances corresponding to the semiconductor device (LSI) 61, and the placement of the estimated number of decoupling capacitances by executing each operation of operations 71 to 76 shown in FIG. 11. In the aforementioned operations, the design apparatus 11 of FIG. 1 judges whether the placement of an additional decoupling cell is necessary or not, based on a numerical value estimated based on data (information) in the files 51 to 53, and stores decoupling cell position information in the file 53. These files 51 to 53 are stored in the storage device 14 shown in FIG. 1. Also, the design apparatus 11 of FIG. 1 stores temporary data estimated in the above operations in the memory 13. The design apparatus 11 may store the temporary data in a storage device, such as the storage device 14 shown in FIG. 1.

As further shown in FIG. 11, in operation 71 (a total amount estimation operation), the design apparatus 11 of FIG. 1 reads the placement information 51 and the coupling information 52, refers to the cell library 531 estimates the total amount of decoupling corresponding to the internal circuit 63 of the semiconductor device 61, and stores the total amount in the memory 13.

As further shown in FIG. 11, in operation 72 (a region charge amount estimation of decoupling operation), the design apparatus 11 of FIG. 1 divides a cell placement region into rectangular regions. The design apparatus 11 of FIG. 1 estimates the total amount of charge of each region, based on the placement information, and stores the data of the total amount of charge 81 in the storage device 14 shown in FIG. 1. Since the power supply noise amount is determined by a current consumption change amount in unit time and the package inductance of the semiconductor device 61, the total amount of charge is a value that represents power supply noise.

As further shown in FIG. 11, in operation 73 (a noise tolerance estimation operation), the design apparatus 11 of FIG. 1 estimates noise tolerance with respect to an allowable delay fluctuation amount due to power supply noise, for instances included in each region, and stores the data of the noise tolerance 82 in the storage device 14.

As further shown in FIG. 11, in operation 74 (a capacitance coefficient estimation operation), the design apparatus 11 of FIG. 1 estimates the decoupling capacitance coefficient of each region from the charge amount and the noise tolerance and stores the data of the decoupling capacitance coefficient 83 in the storage device 14.

As further shown in FIG. 11, in operation 75 (a region capacitance estimation operation), the design apparatus 11 of FIG. 1 distributes the total amount of decoupling estimated in operation 71 among the regions so that the ratio of capacitance including parasitic capacitance in each region matches the ratio of the decoupling capacitance coefficient of each region estimated in operation 74. The design apparatus 11 of FIG. 1 stores the data of the distributed capacitance value of each region (region capacitance) 84 in the storage device 14.

As further shown in FIG. 11, in operation 76 (a decoupling capacitance placement operation), the design apparatus 11 of FIG. 1 places each decoupling capacitance that satisfies the capacitance value of each region distributed in operation 75. In other words, the design apparatus 11 of FIG. 1 generates layout data including the placement information 85 of the layout data 51 and the placement position of the placed decoupling capacitances.

The detail of the operation in each of operations 71 to 76 of FIG. 11 will be described.

The design apparatus 11 of FIG. 1 obtains a total sum of capacitances required in the semiconductor device 61 (Cv) from the operating frequency (F), power consumption (I), and allowable amount of voltage fluctuation due to power supply noise ($\Delta V$) of the semiconductor device 61, using, for example, equation (2). The total amount of decoupling Cv is the total value of the capacitance value of decoupling capacitance placed in the semiconductor device 61 and the capacitance value of the parasitic capacitance of the semiconductor device 61.

$$Cv = \frac{Vdd - \Delta V}{\Delta V} \times \frac{I}{F \times Vdd} \qquad (2)$$

Figure 12:
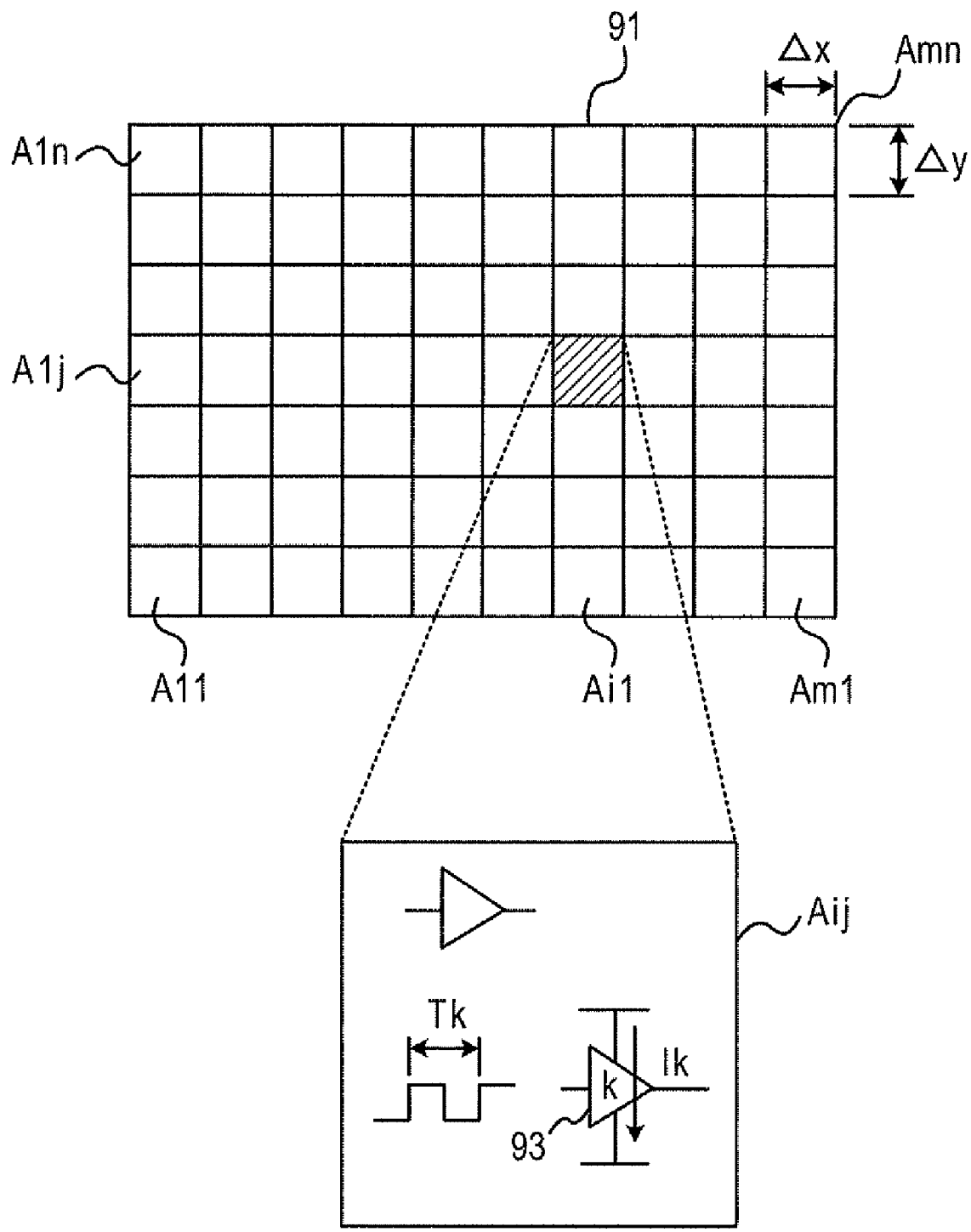
FIG. 12 illustrates an explanatory view of a region division of a cell placement region.

As shown in FIG. 12, the design apparatus 11 of FIG. 1 divides a cell placement region 91 in the semiconductor device 61 into m×n rectangular regions A11 to Amn. The cell placement region 91 is a region in which instances, such as cells, that constitute the internal circuit 63 shown in FIG. 10 are placed, and in an embodiment, a region that forms the internal circuit 63.

As further shown in FIG. 12, the sizes $\Delta x$ and $\Delta y$ of each of the regions A11 to Amn are set, for example, at an upper limit distance at which the decoupling capacitance is effective, that is, a distance at which voltage fluctuation is cancelled out by the decoupling capacitance. The design apparatus 11 of FIG. 1 estimates the current consumption I of each instance included in each of the regions A11 to Amn. Further, the design apparatus 11 of FIG. 1 estimates the amount of charge Q consumed in each region within cycle time from the current consumption I and operating frequency of each instance.

As further shown in FIG. 12, for example, from the product of current consumption in a k-th instance 93, Ik, included in a region Aij, and the operating frequency of the instance 93, that is, the cycle of a signal input to the instance 93, Tk, the amount of charge consumed in the instance 93 within the cycle time Tk, Qk, is obtained. Therefore, the design apparatus 11 of FIG. 1 estimates the total value of charge amounts in the instances included in the region Aij, Qij (=$\Sigma$Ik·Tk). Since the power supply noise amount is determined by a current consumption change amount in unit time and the package inductance of the semiconductor device 61, the total amount of charge is a value that represents power supply noise.

As further shown in FIG. 12, the design apparatus 11 of FIG. 1 applies the allowable delay fluctuation amount $\Delta D$ due to power supply noise to each instance in the region Aij, and obtains a corresponding allowable static voltage fluctuation amount $\Delta V$. The delay fluctuation amount does not depend on a power supply noise waveform and is represented by average voltage within transition time. The allowable static voltage fluctuation amount $\Delta V$ corresponds to noise tolerance for each instance with respect to power supply noise. For a value for the region Aij, the minimum value of the allowable static voltage fluctuation amounts $\Delta V$ of the instances in the region is estimated. An instance having a small allowable static voltage fluctuation amount $\Delta V$ is more easily affected by voltage fluctuation due to power supply noise than an instance having a large allowable static voltage fluctuation amount $\Delta V$. Therefore, the minimum value of the allowable static voltage fluctuation amounts ΔV of a plurality of instances included in a region is the range of voltage fluctuation required to be suppressed in the region.

The delay characteristics of the instances are stored in the cell library 53 shown in FIG. 11. As the delay characteristics of the instances, the result of SPICE simulation, and the like may be used. The allowable delay fluctuation amount ΔD may be estimated, referring to a fixed value, a predetermined rate of ideal delay time Dideal, and a slack amount in timing analysis result, as in the embodiment discussed above.

As further shown in FIG. 12, the design apparatus 11 of FIG. 1 estimates the ratio of the charge amount Q to the allowable static voltage fluctuation amount ΔV corresponding to noise tolerance for each region and determines the result as a decoupling capacitance coefficient α. The decoupling capacitance coefficient α is proportional to the noise amount (the charge amount) and is inversely proportional to the noise tolerance. Therefore, the decoupling capacitance coefficient α is a relative value that relatively represents, for each region, decoupling capacitance required for each region, among the regions.

As further shown in FIG. 12, the design apparatus 11 of FIG. 1 distributes the total amount of decoupling estimated in operation 71 for each region, among the regions, according to the value of the decoupling capacitance coefficient α. The decoupling capacitance coefficient α is a value that relatively represents decoupling capacitance required for each region. Therefore, decoupling capacitance required for the entire semiconductor device 61 corresponds to the total sum of the decoupling capacitance coefficients α (=Σα) of the regions. Therefore, the ratio of capacitance required for the region Aij, Cij, to the total amount of decoupling of the semiconductor device 61, Cv, is equal to the ratio of the decoupling capacitance coefficient of the region Aij, αij, to the total sum Σα (Cij:Cv=Σα:αij). The capacitance value of decoupling capacitance required for the region Aij, Cpij, is obtained by subtracting the capacitance value of parasitic capacitance included in the region Aij, Cpij, from the capacitance required for the region Aij, Cij. Therefore, the capacitance value of decoupling capacitance required for the region Aij, Cdij, is obtained, for example, by equation (3).

$$Cdij = \frac{aij}{\Sigma\alpha} \times Cv - Cpij \quad (3)$$

As further shown in FIG. 12, the design apparatus 11 of FIG. 1 places decoupling capacitance corresponding to the capacitance value of decoupling capacitance Cdij obtained in operation 75, near the instances. In this case, the design apparatus 11 places the number of capacitance cells having a predetermined capacitance (unit capacitance cells) that satisfies the above capacitance value Cdij. The magnitude of the decoupling capacitance may be changed according to the above capacitance value of decoupling capacitance Cdij.

As described above, according to the second embodiment, the following effect is obtained.

(1) The decoupling capacitance 66 having a predetermined capacitance value is placed in the semiconductor device 61. For each region 64 into which a region where the internal circuit 63 is placed is divided, the decoupling capacitance coefficient α of each region 64 according to the total amount of charge consumed in each region 64 is estimated. The total sum of capacitances required in the semiconductor device 61 is distributed among the regions 64, based on the ratio of the total sum of the decoupling capacitance coefficients α, Σα, to the decoupling capacitance coefficient α of each region 64. The capacitance value of the decoupling capacitance 66 is α value estimated based on a capacitance value distributed to each region, and the capacitance value of parasitic capacitance in the region. Therefore, by distributing the total amount of charge consumed in the semiconductor device 61, among each region 64, the decoupling capacitance 66 having a capacitance value corresponding to the noise amount of each region 64 is placed. In this case, capacitance having a preferable capacitance value is placed, and the region of the chip that is occupied by the capacitance is adjusted so that the capacitance value may be not greater than necessary, for example.

The above-described embodiments may have an element coupled between a first power supply line and a second power supply line, and a capacitance coupled between the first power supply line and the second power supply line. The capacitance value of the capacitance may be a capacitance value based on a first value that depends on a period from a change in an input signal input to the element to a change in an output signal output from the element, and a second value that depends on voltage between the first power supply line and the second power supply line.

In this case, since the capacitance value of the capacitance is determined based on the first value corresponding to the operation of the element, and the second value depending on voltage supplied to the element, capacitance having a preferable capacitance value is placed, and the region of the chip that is occupied by the capacitance is adjusted so that the capacitance value may be not greater than necessary, for example.

Also, the above first value may be an allowable delay fluctuation amount of the element, and the second value may be an allowable voltage fluctuation amount between the first power supply line and the second power supply line. In this case, a preferable capacitance value is estimated based on the operation of the element, and voltage that fluctuates due to the operation of the element.

Also, the first value of the semiconductor device may be a value estimated based on the delay time of the output signal with respect to the input signal when the element is at ideal voltage, and the second value may be a value estimated from the first value, based on the electrical characteristics of the element. In this case, since the first value and the second value are each estimated according to the element, capacitance having a capacitance value suitable for the element is placed.

Also, the element of the semiconductor device may be an element on a clock path that propagates a clock signal, and the clock path may propagate the clock signal via a plurality of the elements. The capacitance value may be a value corresponding to a first capacitance value estimated based on the second value, and a second capacitance value estimated based on voltage fluctuation estimated based on a virtual noise waveform in the clock path and a virtual noise waveform in another clock path in an asynchronous relationship with the clock path. In this case, capacitance having a capacitance value considering the influence between the clock paths in an asynchronous relationship is placed.

Also, for the capacitance value of the semiconductor device, for each of a plurality of regions into which a cell placement region where the element is placed is divided, the total amount of charge consumed in each region, and a decoupling capacitance coefficient based on the second value and the total amount of charge may be estimated. The total sum of capacitances required in the semiconductor device may be distributed among the regions, based on the ratio of the total sum of the capacitance coefficients to the capacitance coefficient of each region, and the capacitance value of the semiconductor device may be a value estimated based on a capacitance value distributed to each region, and the capacitance value of parasitic capacitance in the region. In this case, by distributing the total amount of consumed charge, among the regions, capacitance having a capacitance value corresponding to the noise amount of each region is placed.

The above-described embodiments may include the operation of estimating a first value that depends on a period from a change in an input signal input to an element coupled between a first power supply line and a second power supply line to a change in an output signal output from the element; the operation of estimating a second value that depends on voltage between the first power supply line and the second power supply line; and the operation of estimating the capacitance value of capacitance, based on the first value and the second value. In this case, since the capacitance value of the capacitance is determined based on the first value corresponding to the operation of the element, and the second value depending on voltage supplied to the element, capacitance having a preferable capacitance value is placed, and the region of the chip that is occupied by the capacitance is adjusted so that the capacitance value may be not greater than necessary, for example.

Also, in the operation of estimating the first value, the first value may be estimated based on the delay time of the output signal with respect to the input signal when the element is at ideal voltage. In this case, since the first value is estimated according to the element, capacitance having a capacitance value suitable for the element is placed.

Also, in the operation of estimating the second value, the second value is estimated from the first value, based on the electrical characteristics of the element. In this case, since the second value is estimated according to the element, capacitance having a capacitance value suitable for the element is placed.

Also, the element may be an element on a clock path that propagates a clock signal, and the clock path may propagate the clock signal via a plurality of the elements. The operation of estimating the capacitance value may include the operation of generating a virtual noise waveform corresponding to the first value for each of the elements, the operation of estimating a first capacitance value, based on the second value, the operation of generating a synthesized noise waveform in which the virtual noise waveforms corresponding to the elements in the clock path are synthesized, and the operation of, based on the respective virtual noise waveforms of two asynchronous clock paths that affect each other, estimating a maximum value of voltage fluctuation between the first power supply line and the second power supply line in one clock path, and estimating from the maximum value a second capacitance value in the one clock path considering the influence of noise generated in the other clock path. In this case, capacitance having a capacitance value considering the influence between the clock paths in an asynchronous relationship is placed.

Also, the method of estimating a capacitance value may include the operation of estimating the total sum of capacitances required in a semiconductor device, the operation of dividing a cell placement region of the semiconductor device into a plurality of regions and estimating the total amount of charge consumed in each region, the operation of estimating the first value for the element in the region and estimating the second value from the first value, the operation of estimating a decoupling capacitance coefficient in each region, based on the second value and the total amount of charge, and the operation of distributing the total sum of capacitances among the regions, based on the ratio of the total sum of the capacitance coefficients to the capacitance coefficient of each region, and estimating the capacitance value of the capacitance placed in each region, based on a capacitance value distributed to each region, and the capacitance value of the parasitic capacitance of each region. In this case, since the capacitance value of the capacitance is determined based on the first value corresponding to the operation of the element, and the second value depending on voltage supplied to the element, capacitance having a preferable capacitance value is placed, and the region of the chip that is occupied by the capacitance is adjusted so that the capacitance value may be not greater than necessary, for example.

When with the reduction of the chip area of a semiconductor device, the reduction of a region occupied by decoupling capacitance is demanded, a semiconductor device in which a region occupied by decoupling capacitance is adjusted, and a method of estimating the capacitance value of capacitance placed in the semiconductor device are provided according to the above-described embodiments.

Although a few embodiments have been shown and described, it would be appreciated by those skilled in the art that changes might be made in these embodiments without departing from the principles and spirit of the invention, the scope of which is defined in the claims and their equivalents.

Numbers applying embodiments (first, second or third etc.) do not show priorities of the embodiments. Many variations and modifications will be apparent to those skilled in the art.

Although a few embodiments have been shown and described, it would be appreciated by those skilled in the art that changes may be made in these embodiments without departing from the principles and spirit of the invention, the scope of which is defined in the claims and their equivalents.

What is claimed is:

1. A semiconductor device, comprising:
an element having electrical characteristics and coupled between a first power supply line and a second power supply line; and
a capacitor coupled between the first power supply line and the second power supply line;
wherein a capacitance value of the capacitor is estimated by considering a first value that depends on a period from a change in an input signal input to the element to a change in an output signal output from the element, and a second value that depends on a voltage between the first power supply line and the second power supply line, and
said considering determines the capacitance value relative to an operation of the element and voltage that fluctuates due to the operation of the element using the first value and the second value.

2. The semiconductor device according to claim 1, wherein the first value relates to an allowable delay fluctuation amount of the element, and
the second value relates to an allowable voltage fluctuation amount between the first power supply line and the second power supply line.

3. The semiconductor device according to claim 2, wherein the first value is a value estimated based on a delay time of the output signal with respect to the input signal when the element is at an ideal voltage, and
the second value is a value estimated from the first value, based on electrical characteristics of the element.

4. The semiconductor device according to claim 2, wherein the element is an element on a clock path that propagates a clock signal, and the capacitance value relates to a value corresponding to a first capacitance value estimated based on the second value, and a second capacitance value estimated based on a voltage fluctuation estimated based on a virtual noise waveform in the clock path and a virtual noise waveform in another clock path that is in an asynchronous relationship with the clock path.

5. The semiconductor device according to claim 1, wherein for each of a plurality of regions into which a cell placement region where the element is placed is divided, a total amount of charge consumed in each region, and a decoupling capacitance coefficient based on the second value and a total amount of charge are estimated,
a total sum of capacitances required in the semiconductor device is distributed among the regions, based on a ratio of a total sum of capacitance coefficients to a capacitance coefficient of each region, and
the capacitance value is a value estimated based on a capacitance value distributed to each region, and a capacitance value of parasitic capacitance in the region.

6. A method for estimating a capacitance value, the method comprising:
the method being implemented by a semiconductor device configured to execute an operation including:
estimating a first value that depends on a period from a change in an input signal input to an element having electrical characteristics and coupled between a first power supply line and a second power supply line, to a change in an output signal output from the element;
estimating a second value that depends on voltage between the first power supply line and the second power supply line; and
estimating a capacitance value of a capacitor coupled between the first power supply line and the second power supply line, based on the first value and the second value, and
where said estimating of the capacitance value determines the capacitance value relative to an operation of the element and voltage that fluctuates due to the operation of the element using the first value and the second value.

7. The method according to claim 6, wherein in the estimating of the first value, the first value is estimated based on a delay time of the output signal with respect to the input signal when the element is at an ideal voltage.

8. The method according to claim 6, wherein in the estimating of the second value, the second value is estimated from the first value, based on electrical characteristics of the element.

9. The method according to claim 6, wherein the element is an element on a clock path that propagates a clock signal, and the estimating the capacitance includes:
generating a virtual noise waveform corresponding to the first value for each of elements,
estimating a first capacitance value, based on the second value,
generating a synthesized noise waveform in which virtual noise waveforms corresponding to the elements in the clock path are synthesized, and based on respective virtual noise waveforms of two asynchronous clock paths that affect each other, estimating a maximum value of a voltage fluctuation between the first power supply line and the second power supply line in one clock path, and
estimating from the maximum value a second capacitance value in the one clock path considering an influence of noise generated in the other clock path.

10. The method according to claim 6, comprising:
estimating a total sum of capacitances required in the semiconductor device,
dividing a cell placement region of the semiconductor device into a plurality of regions and estimating a total amount of charge consumed in each of the cell placement regions,
estimating the first value for the element in the cell placement region and estimating the second value from the first value,
estimating a decoupling capacitance coefficient in each of the cell placement regions, based on the second value and the total amount of charge, and
distributing the total sum of capacitances among the cell placement regions, based on a ratio of a total sum of capacitance coefficients to a capacitance coefficient of each of the cell placement regions, and estimating the capacitance value of the capacitance placed in each of the cell placement regions, based on a capacitance value distributed to each of the cell placement regions, and a capacitance value of parasitic capacitance of each of the cell placement regions.

11. A method of estimating a capacitance value, comprising:
the method including an operation of a semiconductor device having a plurality of elements, including:
estimating a delay constraint indicating an allowable delay fluctuation amount based on an operation of the semiconductor device;
estimating an allowable voltage fluctuation amount based on the allowable delay fluctuation amount;
estimating a capacitance value of a capacitor for an operation of one of the plurality of elements based on the allowable voltage fluctuation amount; and
adjusting information of a placement region of the capacitor based on the capacitance value estimated.

* * * * *